United States Patent [19]
Inn

[11] Patent Number: 5,943,635
[45] Date of Patent: Aug. 24, 1999

[54] SYSTEM AND METHOD FOR PROGRAMMABLE BROWN-OUT DETECTION AND DIFFERENTIATION

[75] Inventor: Bruce L. Inn, San Jose, Calif.

[73] Assignee: Scenix Semiconductor Inc., Santa Clara, Calif.

[21] Appl. No.: 08/990,518

[22] Filed: Dec. 12, 1997

[51] Int. Cl.$^6$ .................................................. G01R 19/00
[52] U.S. Cl. ............................ 702/60; 702/64; 702/190; 326/80; 326/81
[58] Field of Search ........................... 702/60, 64, 189, 702/190; 395/750.08; 365/226, 229; 327/143, 50; 326/80.81, 162

[56] References Cited

U.S. PATENT DOCUMENTS

| | | | |
|---|---|---|---|
| 3,670,246 | 6/1972 | Gately | 324/133 |
| 3,969,635 | 7/1976 | Wilke | 307/235 |
| 4,031,463 | 6/1977 | Norberg | 324/77 |
| 4,117,526 | 9/1978 | Bates | 361/92 |
| 4,155,041 | 5/1979 | Burns et al. | 325/56 |
| 4,210,829 | 7/1980 | Wong et al. | 307/296 |
| 4,234,920 | 11/1980 | Van Ness et al. | 364/200 |
| 4,260,907 | 4/1981 | Winebarger | 307/264 |
| 4,296,338 | 10/1981 | Thomas | 307/362 |
| 4,301,380 | 11/1981 | Thomas | 307/362 |
| 4,327,410 | 4/1982 | Patel et al. | 364/200 |
| 4,354,613 | 10/1982 | Desai et al. | 221/4 |
| 4,422,163 | 12/1983 | Oldenkamp | 365/229 |
| 4,523,295 | 6/1985 | Zato | 364/900 |
| 4,562,550 | 12/1985 | Beatty et al. | 364/492 |
| 4,567,539 | 1/1986 | Sinberg | 361/92 |
| 4,692,739 | 9/1987 | Dorn | 340/365 |
| 4,701,639 | 10/1987 | Stanojevic | 307/350 |
| 4,716,463 | 12/1987 | Stacy et al. | 358/190 |
| 4,716,521 | 12/1987 | Nagae | 364/200 |
| 4,857,770 | 8/1989 | Partovi et al. | 307/451 |
| 5,164,613 | 11/1992 | Mumper et al. | 307/272.3 |
| 5,187,389 | 2/1993 | Hall et al. | 307/350 |
| 5,237,699 | 8/1993 | Little et al. | 395/750 |
| 5,258,758 | 11/1993 | Sooch | 341/144 |
| 5,265,018 | 11/1993 | Sokol et al. | 364/424.1 |
| 5,267,157 | 11/1993 | Churchill et al. | 364/424.1 |
| 5,315,549 | 5/1994 | Scherpenberg et al. | 365/189.09 |

(List continued on next page.)

FOREIGN PATENT DOCUMENTS

| | | | |
|---|---|---|---|
| 54-162577 | 12/1979 | Japan | G01R 19/16 |

OTHER PUBLICATIONS

"COP820CJ/COP822CJ/COP823CJ Single–Chip microCMOS Microcontroller", *Embedded Controllers Databook*, National Semiconductor Corporation, 1992 Edition, pp. 2–27, 2–32–2–34.

*Primary Examiner*—John Barlow
*Assistant Examiner*—Bryan Bui
*Attorney, Agent, or Firm*—Fenwick & West LLP

[57] ABSTRACT

A system and method for detecting brown-out conditions in a microcontroller, enabling a user to program the brown out detection system, and distinguishing between real brown-out events and transitory voltage swings without requiring expensive and time consuming logic. The invention compares a sense voltage to a reference voltage and filters the resulting signal to distinguish between a true-brown out signal and transitory voltage swings. The invention uses one or more program bits that vary the ratio of the supply voltage and the sense voltage. That is, the sense voltage is programmable and is dependent upon the value of the supply voltage and the value of the program bits. The present invention generates a comparison output signal based upon the comparison of the supply voltage and the sense voltage. The comparison output signal is filtered to distinguish between a real brown-out event and transitory voltage swings.

18 Claims, 3 Drawing Sheets

U.S. PATENT DOCUMENTS

| | | | |
|---|---|---|---|
| 5,321,323 | 6/1994 | Lehmann | 307/475 |
| 5,330,513 | 7/1994 | Nichols et al. | 607/32 |
| 5,359,233 | 10/1994 | Mumper et al. | 307/272.3 |
| 5,365,214 | 11/1994 | Angott et al. | 340/328 |
| 5,376,920 | 12/1994 | Baily | 340/654 |
| 5,406,140 | 4/1995 | Wert et al. | 326/81 |
| 5,523,978 | 6/1996 | Yoon et al. | 365/226 |
| 5,530,877 | 6/1996 | Hanoaka | 395/750 |
| 5,539,910 | 7/1996 | Brueckmann et al. | 395/750 |
| 5,550,362 | 8/1996 | Sherman | 235/455 |
| 5,564,010 | 10/1996 | Henry et al. | 395/182.2 |
| 5,581,206 | 12/1996 | Chevallier et al. | 327/143 |
| 5,583,820 | 12/1996 | Padoan et al. | 365/226 |
| 5,606,511 | 2/1997 | Yach | 395/750.08 |
| 5,678,049 | 10/1997 | Massie | 395/750.08 |
| 5,717,907 | 2/1998 | Kuddes et al. | 395/555 |
| 5,739,700 | 4/1998 | Martin | 326/80 |
| 5,767,698 | 6/1998 | Emeigh et al. | 326/80 |
| 5,767,711 | 6/1998 | Chevallier et al. | 327/143 |

SYSTEM AND METHOD FOR PROGRAMMABLE BROWN-OUT DETECTION AND DIFFERENTIATION

BACKGROUND OF THE INVENTION

1. Field of the Invention

The invention relates to the field of computer microcontrollers and more particularly to the field of programmable brown-out detection in a microcontroller environment.

2. Description of Background Art

Recent advances in technology have led to an increase in performance and a decrease in size of semiconductor microcontroller or microprocessor chips. Microcontrollers are devices that can control the operation of many items, e.g., braking systems in automobiles, automatic water sprinklers, and cellular telephones. Microcontrollers generally receive power from a supply voltage that is external to the microcontroller. In order to ensure proper operation, many conventional microcontrollers employ a brown-out detection system for detecting drops in the voltage level of a signal received from the supply voltage.

Brown-out detection systems detect when a supply voltage level drops below a minimum level that is necessary for proper operation of the microcontroller and/or the item using the microcontroller. Brown-out detection systems protect the microcontroller against total power failure and against "dips" in the received voltage signal.

In some conventional brown-out systems the received voltage signal is compared with a predetermined voltage reference signal. If the received voltage signal drops below the predetermined voltage reference signal the microcontroller issues a reset signal which ensures that the microcontroller will not operate with a low input voltage which, otherwise, can result in a malfunction of the microcontroller. A problem with such conventional systems is the requirement that the reference voltage and the ratio between the supply voltage and a voltage supply comparison voltage be predetermined.

Another problem with conventional brown-out detection systems is that they are not capable of distinguishing between a real brown-out condition from mere signal noise without expensive circuitry which requires additional elements, e.g., hysteresis logic. As an example, a true brown-out event may correspond to a sustained drop in the level of the received voltage signal or may correspond to a fast deep drop in the voltage signal level. However, transitory noise from input/output (I/O) switching, for example, can cause relatively shallow dips of the supply voltage which drop below the reference voltage and quickly return to an acceptable voltage level. Conventional brown-out detection circuits immediately initiates a microcontroller reset after the first instance of the voltage level dropping below the voltage reference. The operation of the microcontroller begins again only if the received voltage signal level exceeds the reference voltage after the expiration of a set period. Such conventional systems cause an unnecessary disruption in the microcontroller operation.

Some conventional systems disclose a device that purports to distinguish between real brown-out events and transitory voltage swings. However, such systems require expensive logic including multiple filters and hysteresis. Specifically, U.S. Pat. No. 5,606,511 to Yach (hereafter referred to as "Yach"), which is incorporated by reference herein in its entirety, describes a brown-out detection system that purports to distinguish between real brown-out conditions and transitory noise signals. Yach describes a system in which at least two voltages are sampled and filtered from the voltage supply signal ($V_{DD}$), see FIG. 2, 5A, and 5B in Yach, for example. Yach requires two separate filtered voltage sample signals (V1 and V2). The V1 signal is filtered once and the V2 signal is filtered twice, see FIGS. 5A and 5B in Yach. The voltage level of V1 and V2 with respect to $V_{DD}$ is based solely upon the filters and upon the resistors 36, 37, and 38 in FIG. 5B, i.e., the values of V1 and V2 are not programmable and are used merely to provide hysteresis boundaries. The hysteresis voltages (V1, V2) are both compared to a reference voltage and a reset signal is only generated if the voltage level of both V1 and V2 are less than the reference voltage. Similarly, the Yach system only clears the reset (begins normal operation) after the voltage level of both V1 and V2 exceed the reference voltage. Yach states beginning at column 2, line 53 that "[h]ysteresis greatly assists the dual comparator to distinguish a true brown-out event from normal noise or other slight perturbations, and is achieved be dual sampling of the power supply and establishing a pair of trip points for comparison with excursion of the supply voltage level." It is apparent that the Yach system is a complex and expensive technique.

What is needed is a system and method: (1) for detecting brown-out conditions in a microcontroller; (2) for enabling a user to program the brown out detection system; and (3) for distinguishing between real brown-out events and transitory voltage swings without requiring expensive and time consuming logic.

SUMMARY OF THE INVENTION

The invention is a system and method for detecting brown-out conditions in a microcontroller, enabling a user to program the brown out detection system, and distinguishing between real brown-out events and transitory voltage swings without requiring expensive and time consuming logic. The invention compares a sense voltage to a reference voltage and filters the resulting signal to distinguish between a true-brown out signal and transitory voltage swings. The invention uses one or more program bits that vary the ratio of the supply voltage and the sense voltage. That is, the sense voltage is programmable and is dependent upon the value of the supply voltage and the value of the program bits. The present invention generates a comparison output signal based upon the comparison of the supply voltage and the sense voltage. The comparison output signal is filtered to distinguish between a real brown-out event and transitory voltage swings.

DETAILED DESCRIPTION OF THE PREFERRED EMBODIMENTS

A preferred embodiment of the present invention is now described with reference to the figures where like reference numbers indicate identical or functionally similar elements.

Also in the figures, the left most digits of each reference number corresponds to the figure in which the reference number is first used.

Figure 1:
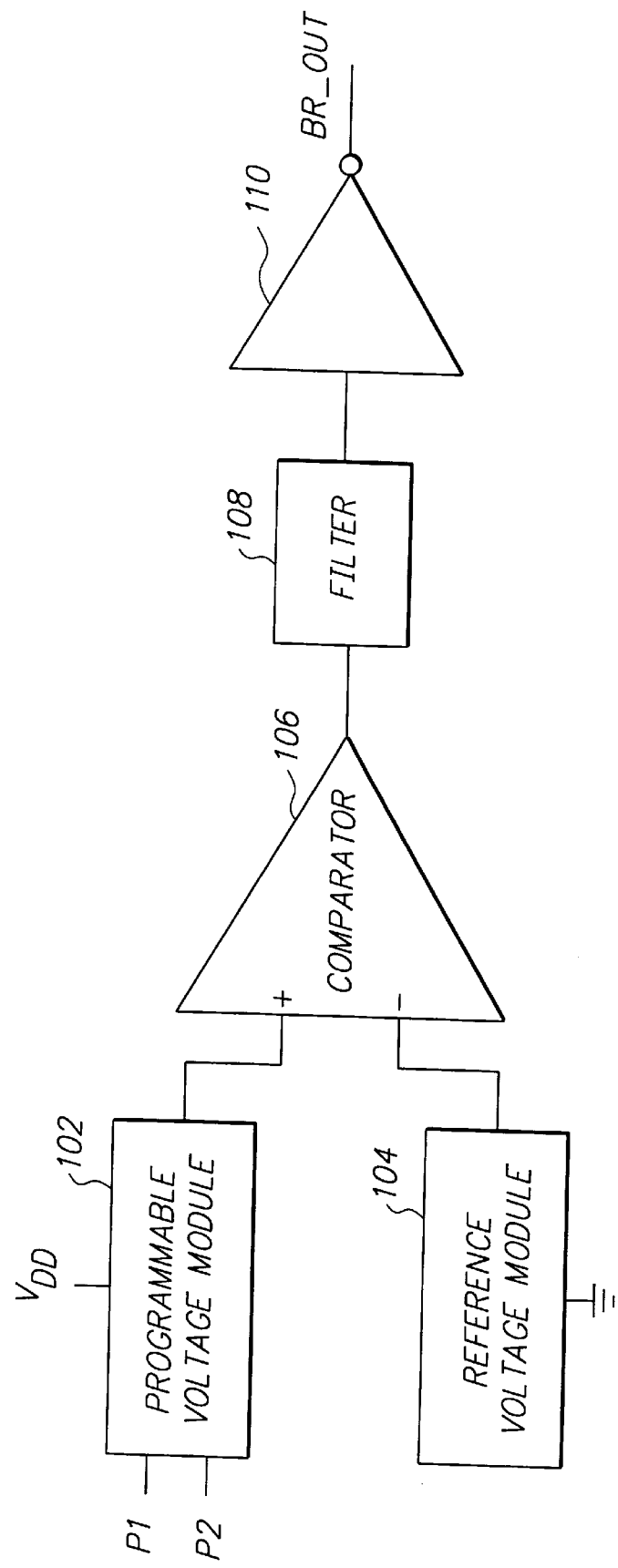
FIG. 1 is a block diagram of a brown-out detection circuit according to one embodiment of the present invention.

FIG. 1 is a block diagram of a brown-out detection circuit according to one embodiment of the present invention. The brown-out detection circuit of one embodiment includes a programmable voltage module 102, a reference voltage module 104, a comparator 106, a filter 108, and an optional buffer amplifier 110. The programmable voltage module 102 receives the supply voltage $V_{DD}$ and one or more program bits. In one embodiment of the present invention two program bits (P1 and P2) are used. The programmable voltage module 102 outputs a voltage $V_{SENSE}$ that is received by the comparator 106. The value of $V_{SENSE}$ is dependent upon the value of $V_{DD}$ and the value of the program bits (P1, P2). The reference voltage module 104 generates a reference voltage ($V_{REF}$) that is received by the comparator 106. The comparator 106 compares $V_{SENSE}$ and $V_{REF}$ to generate a signal $V_{COMPOUT}$ that is filtered by the filter 108 to distinguish between a true brown-out condition and a transient voltage drop. The filtered signal can be received by a buffer and amplifier 110 that translates $V_{COMPOUT}$ to logic levels compatible with the system in which the brown out system is used.

Figure 2:
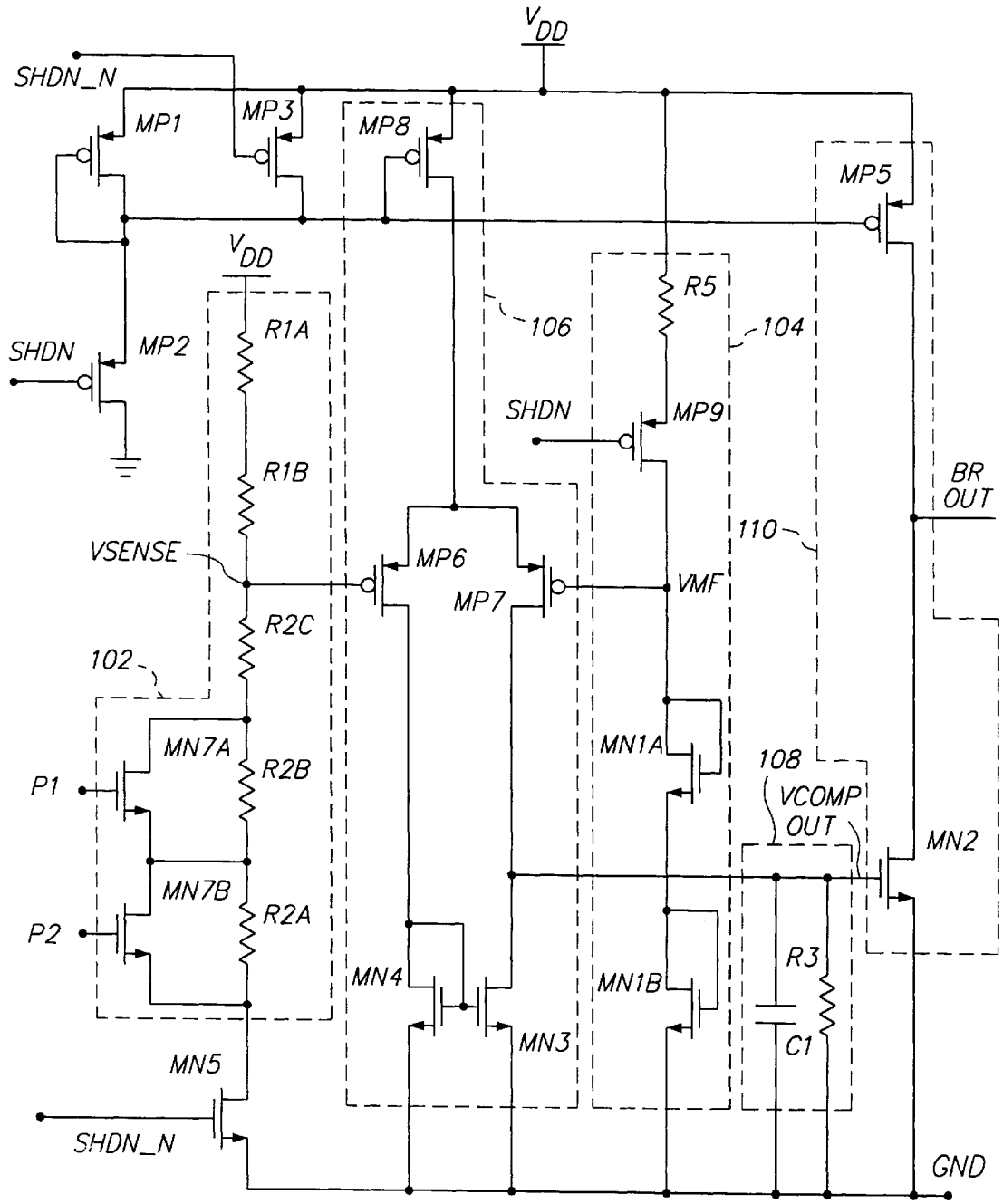
FIG. 2 is a more detailed illustration of the brown-out detection circuit according to one embodiment of the present invention.

FIG. 2 is a more detailed illustration of the brown-out detection circuit according to one embodiment of the present invention. In this embodiment the programmable voltage module 102 includes five resistors and two transistors. The resistors are R1A, R1B, R2A, R2B, and R2C. The transistors are n-channel metal oxide semiconductor field effect transistors (nmos) and are referred to as MN7A, MN7B in FIG. 2. In this embodiment R1A is a 4 kilo-ohm (k) resistor, R1B is a 28 k resistor, R2C is a 20 k resistor, R2B is a 10 k resistor, and R2A is a 10 k resistor. The two transistors have a width of 10 microns (U) and a length of 1 U. MN7A receives the first program signal (P1) at its gate and operates in parallel with resistor R2B. MN7B receives the second program signal (P2) at its gate and operates in parallel with resistor R2A.

The output of the programmable voltage module ($V_{SENSE}$) appears at the node between resistor R1B and R2C. The programmable voltage module receives a signal from the supply voltage ($V_{DD}$) and divides the voltage using the resistors (R1A–B, R2A–C) to generate the output voltage $V_{SENSE}$ that is proportional to the supply voltage $V_{DD}$. However, the ratio of $V_{SENSE}/V_{DD}$ is programmable by the user. Specifically, if the user sets the first program signal (P1) high, the gate of MN7A will exceed its source and the transistor MN7A conducts to effectively form a short circuit in parallel to resistor R2B. The result is that the ratio of $V_{SENSE}/V_{DD}$ decreases and the output voltage $V_{SENSE}$ decreases for a given supply voltage.

Similarly, if the user sets the second program signal (P2) high, the gate of MN7B will exceed its source and the transistor MN7B conducts to effectively form a short circuit in parallel to resistor R2A. The result is that the ratio of $V_{SENSE}/V_{DD}$ decreases and the output voltage $V_{SENSE}$ decreases for a given supply voltage. If both P1 and P2 are set high, the ratio further decreases. It will be apparent to persons skilled in the art that various resistor values and transistor strengths can be used without departing from the scope of the present invention. In alternate embodiments, additional transistor/resistor pairs are present and additional program signals are received in order to enable the user to more precisely set the $V_{SENSE}/V_{DD}$ ratio.

The reference voltage module 104 includes three transistors and a resistor. The three transistors are nmos transistors MN1A and MN1B and p-channel metal oxide semiconductor field effect transistor (pmos) MP9. The resistor is reference number R5. In this embodiment transistors MN1A and MN1B each have a length of 5 U and a width of 10 U. Transistor MP9 has a length of 2 U and a width of 15 U. Resistor R5 has a resistance of 400 k, which can be accomplished using a transistor having a length of 250 U and having a width of 2.5 U, for example. The reference signal $V_{REF}$ is the signal at the node between the drain of MN1A and the drain of MP9. It will be apparent that the reference voltage is substantially constant and does not substantially vary based upon variations in the supply voltage $V_{DD}$ because the impedance of resistor R5 is so great when compared to the incremental impedance across MN1A and MN1B.

The comparator 106 includes five transistors. nmos transistors MN3 and MN4 and pmos transistors MP6, MP7, and MP8. In this embodiment, transistors MN3 and MN4 have a width of 20 U and a length of 4 U. Transistors MP6 and MP7 have length of 2 U and a width of 20 U and transistor MP8 has a length of 2 U and a width of 10 U. When the gate of MP8 is low compared to its source, MP8 conducts and biases MP6 and MP7. When $V_{SENSE}$ exceeds $V_{REF}$ MP7 is conducting while MP6 is not significantly conducting and $V_{COMPOUT}$ begins rising. When $V_{REF}$ exceeds $V_{SENSE}$ MP6 is conducting while MP6 is not significantly conducting and $V_{COMPOUT}$ begins decreasing. The output of the comparator 106 is a signal at the drain of MN3, i.e., $V_{COMPOUT}$.

The output of the comparator 106 ($V_{COMPOUT}$) is filtered using, in this embodiment, an RC filter 108 comprising capacitor C1 and resistor R3. In the embodiment illustrated in FIG. 2 the resistor is a 2000 k resistor and the capacitor has a capacitance of approximately 3 picofarads. The filter 108 reduces the effect of transient voltage variations. For example, a small voltage variation or a small voltage spike is filtered so that a brown out signal is not generated to eliminate unnecessary brown out signals. However, the filter 106 does not prevent the detection of a large voltage variation, e.g., a large voltage spike. That is, the filter 108 distinguishes between a real brown-out condition and a transient voltage variation. The output of the filter 106 is received by the buffer 110.

The buffer 110 includes two transistors identified as MP5 and MN2. Transistor MP5 is a pmos transistor having a length of 2 U and a width of 10 U. Transistor MN2 is an nmos transistor having a length of 2 U and a width of 10 U. The buffer 110 illustrated in FIG. 2 is an inverter that buffers the output of the comparator 106 and filter 108. The output of the buffer 110 is a brown out signal (BR_OUT). In one embodiment, the brown out signal is transmitted through additional logic (not shown) such that the signal (BR_OUT) transitions quickly between a "low" voltage and a "high" voltage and vice versa. One example of such logic is a series of inverters. The operation of the brown-out circuit illustrated in FIG. 2 is described in additional detail below with reference to the timing diagram example illustrated in FIG. 3.

Although optional for the present invention, FIG. 2 illustrates an additional shut down function that will cause the present invention to generate a brown-out signal (BR_OUT). The shutdown function logic includes transistors MP1, MP2, MP3, and MN5. In one embodiment, MP1 is a pmos transistor having a length of 2 U and a width of 10 U, MP2 is a pmos transistor having a length of 3 U and a width of 20 U, MP3 is a pmos transistor having a length of 1 U and a width of 5 U, and MN5 is an nmos transistor having a length of 1 U and a width of 5 U. The shutdown signal (SHDN) and its complementary value (SHDN_N) are received in the locations illustrated in FIG. 2. In shutdown mode the SHDN signal is high which causes transistor MP3 to conduct and brings the gate of transistor MP5 to a voltage low enough to cause MP5 to conduct. Transistor MP5 conducts and the brown-out signal is proportional to $V_{DD}$.

Figure 3:
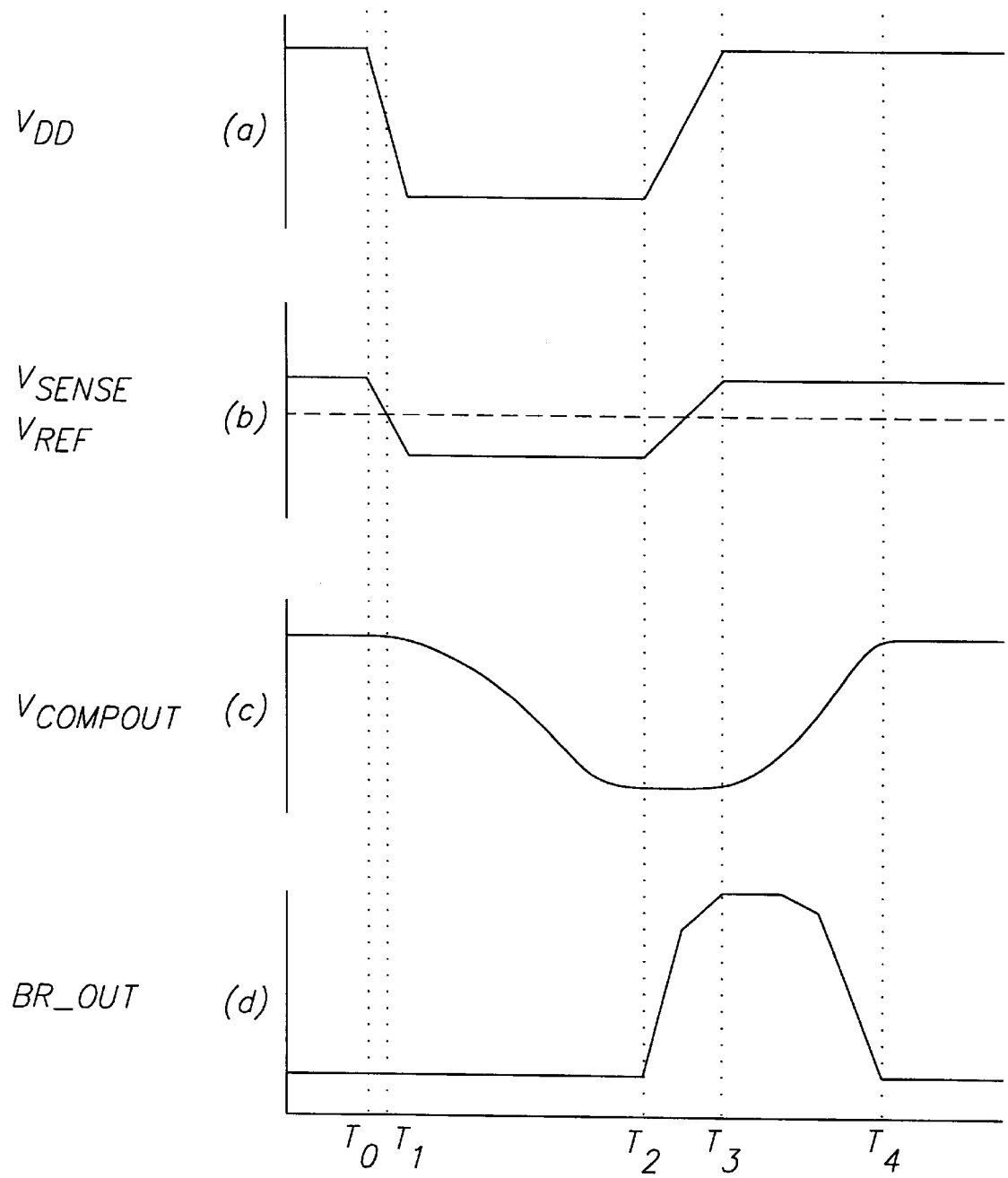
FIG. 3 are timing diagrams illustrating the voltage levels at various nodes of the brown-out detection circuit illustrated in FIG. 2 for a supply voltage signal according to one embodiment of the present invention.

FIG. 3 are timing diagrams illustrating the voltage levels at various nodes of the brown-out detection circuit illustrated in FIG. 2 for a supply voltage signal according to one embodiment of the present invention. One example of a supply voltage signal ($V_{DD}$) is illustrated in the timing diagram 3(a). The voltages received by the comparator 106 ($V_{REF}$ and $V_{SENSE}$) are illustrated in the timing diagram 3(b). The filtered voltage signal $V_{COMPOUT}$ is illustrated in the timing diagram 3(c). The brown out signal (BR_OUT) output from the buffer 110 is illustrated in the timing diagram 3(d).

At time $T_0$ the supply voltage signal begins a voltage spike. At this time $V_{SENSE}$ begins decreasing, while $V_{REF}$ remains substantially constant. At $T_1$ $V_{SENSE}$ drops below $V_{REF}$ and the value of $V_{COMPOUT}$ begins to drop. The supply voltage $V_{DD}$ begins to increase at $T_2$ and is back to its normal value, e.g., 5 volts or 3.3. volts, at time $T_3$. Due to the filter 110, the voltage level of the filtered signal $V_{COMPOUT}$ drops slowly until it drops below a minimum required voltage level at time $T_2$ which causes the brown out signal (BR_$_{OUT}$) to begin rising. At time $T_3$ $V_{COMPOUT}$ begins rising and reaches its original voltage level at time $T_4$. The brown out signal reaches its peak at $T_5$ and is back to its original voltage level at time $T_4$.

While the invention has been particularly shown and described with reference to a preferred embodiment and several alternate embodiments, it will be understood by persons skilled in the relevant art that various changes in form and details can be made therein without departing from the spirit and scope of the invention.

What is claimed is:

1. A system for detecting a brown-out condition in a microcontroller, the microcontroller receiving a supply voltage signal, the system comprising:
   a programmable voltage generator, disposed to receive the supply voltage signal and a first programming signal, for generating a first voltage signal having a voltage level that is substantially equal to a first percentage of said supply voltage if said first programming signal has a first value, and is substantially equal to a second percentage of said supply voltage if said first programming signal has a second value; said programmable voltage generator includes:
      one or more drop resistors having a first input node and a first output node for receiving said supply voltage at said first input node;
      a first switch resistor positioned between said output node and a low voltage node; and
      a first programmable switch coupled in parallel to said first switch resistor and receiving said first programming signal, said first programmable switch forming a low impedance path across said first switch resistor when said first programming signal has said first value, said first programmable switch forming a high impedance path across said first switch resistor when said first programming signal has said second value;
   a voltage reference generator for generating a voltage reference signal;
   a comparator, disposed to receive said first voltage signal and said reference voltage signal, for comparing voltage levels of said first voltage signal and said reference voltage signal and generating a comparator output signal representing the result of said comparison; and
   a filter for filtering said comparator output signal and for distinguishing between real brown-out condition from a transient voltage swings that do not represent a real brown-out event.

2. The system of claim 1, wherein said first percentage is less than said second percentage.

3. The system of claim 2, further comprising:
   a second switch resistor positioned between said output node and a low voltage node; and
   a second programmable switch coupled in parallel to said second switch resistor and receiving a second programming signal, said second programmable switch forming a low impedance path across said second switch resistor when said second programming signal has said first value, said second programmable switch forming a high impedance path across said second switch resistor when said second programming signal has said second value.

4. The system of claim 3, wherein said first and second switch resistors are coupled serially.

5. The system of claim 1, further comprising:
   a buffer, coupled to said filter, for generating a brown out signal.

6. The system of claim 1, further comprising:
   a shutdown module, for receiving a shutdown signal and for setting a reset signal in response to said shutdown signal.

7. A method for detecting a brown-out condition in a microcontroller comprising the steps of:
   receiving a voltage supply signal;
   receiving a first programming signal;
   generating a first voltage signal in response to said supply signal and said first programming signal, said first voltage signal having a voltage level that is substantially equal to a first percentage of said supply voltage if said first programming signal has a first value, and is substantially equal to a second percentage of said supply voltage if said first programming signal has a second value;
   forming a low impedance path via a first programmable switch across a first switch resistor when said first programming signal has said first value;
   forming a high impedance path via said first programmable switch across said first switch resistor when said first programming signal has said second value;
   generating a voltage reference signal;
   comparing voltage levels of said first voltage signal and said reference voltage signal and generating a comparator output signal representing the result of said comparison; and
   filtering said comparator output signal and for distinguishing between real brown-out condition from a transient voltage swings that do not represent a real brown-out event;
   wherein a first input node of a first of one or more drop resistor receives said supply voltage, said one or more drop resistors having a first output node;
   wherein said first switch resistor is positioned between said output node and a low voltage node and is coupled in parallel to said first programmable switch.

8. The method of claim 7, wherein said first percentage is less than said second percentage.

9. The method of claim 7, further comprising the steps of:

receiving a second programming signal at a second programmable switch that is coupled in parallel to a second switch resistor, forming a low impedance path via said second programmable switch across said second switch resistor when said second programming signal has said first value; and forming a high impedance path via said second programmable switch across said second switch resistor when said second programming signal has said second value.

10. The method of claim 9, wherein said first and second switch resistors are coupled serially.

11. The method of claim 7, further comprising the step of:

buffering said filtered signal to generate a brown out signal.

12. A system for detecting a brown-out condition in a microcontroller comprising:

first means for receiving a voltage supply signal;

second means for receiving a first programming signal;

first generating means for generating a first voltage signal in response to said supply signal and said first programming signal, said first voltage signal having a voltage level that is substantially equal to a first percentage of said supply voltage if said first programming signal has a first value, and is substantially equal to a second percentage of said supply voltage if said first programming signal has a second value;

first impedance means for forming a low impedance path via a first programmable switch across a first switch resistor when said first programming signal has said first value and for forming a high impedance path via said first programmable switch across said first switch resistor when said first programming signal has said second value;

second generating means for generating a voltage reference signal;

comparison means for comparing voltage levels of said first voltage signal and said reference voltage signal and generating a comparator output signal representing the result of said comparison;

filter means for filtering said comparator output signal and for distinguishing between real brown-out condition from a transient voltage swings that do not represent a real brown-out event;

wherein a first input node of a first of one or more drop resistor receives said supply voltage, said one or more drop resistors having a first output node;

wherein said first switch resistor is positioned between said output node and a low voltage node and is coupled in parallel to said first programmable switch.

13. The system of claim 12, wherein said first percentage is less than said second percentage.

14. The system of claim 12, further comprising:

third means for receiving a second programming signal at a second programmable switch that is coupled in parallel to a second switch resistor; and second impedance means for forming a low impedance path via said second programmable switch across said second switch resistor when said second programming signal has said first value and for forming a high impedance path via said second programmable switch across said second switch resistor when said second programming signal has said second value.

15. The system of claim 14, wherein said first and second switch resistors are coupled serially.

16. The system of claim 15, further comprising:

shutdown means, for receiving a shutdown signal and for setting a reset signal in response to said shutdown signal.

17. The system of claim 12, further comprising:

buffering means for buffering said filtered signal to generate a brown out signal.

18. The system of claim 17, further comprising:

shutdown means, for receiving a shutdown signal and for setting a reset signal in response to said shutdown signal.

\* \* \* \* \*